United States Patent
Tauzin et al.

(10) Patent No.: US 10,236,210 B2
(45) Date of Patent: Mar. 19, 2019

(54) DIRECT BONDING METHOD

(71) Applicant: COMMISSARIAT A L'ENERGIE ATOMIQUE ET AUX ENERGIES ALTERNATIVES, Paris (FR)

(72) Inventors: Aurélie Tauzin, St Egreve (FR); Bruno Imbert, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/573,699

(22) PCT Filed: May 12, 2016

(86) PCT No.: PCT/EP2016/060653
§ 371 (c)(1),
(2) Date: Nov. 13, 2017

(87) PCT Pub. No.: WO2016/180917
PCT Pub. Date: Nov. 17, 2016

(65) Prior Publication Data
US 2018/0151436 A1 May 31, 2018

(30) Foreign Application Priority Data
May 13, 2015 (FR) .................... 15 54312

(51) Int. Cl.
*H01L 21/78* (2006.01)
*H01L 21/324* (2006.01)
(Continued)

(52) U.S. Cl.
CPC ...... *H01L 21/7806* (2013.01); *H01L 21/3245* (2013.01); *H01L 21/76254* (2013.01);
(Continued)

(58) Field of Classification Search
None
See application file for complete search history.

(56) References Cited

U.S. PATENT DOCUMENTS

2012/0003813 A1* 1/2012 Chuang ............... H01L 21/0206
438/458

FOREIGN PATENT DOCUMENTS

| EP | 1 635 396 A1 | 3/2006 |
| EP | 1 664 396 A1 | 6/2006 |
| EP | 1 881 528 A1 | 1/2008 |

OTHER PUBLICATIONS

Jul. 29, 2016 International Search Report issued in International Patent Application No. PCT/EP2016/060653.
(Continued)

*Primary Examiner* — Asok K Sarkar
(74) *Attorney, Agent, or Firm* — Oliff PLC

(57) ABSTRACT

The method is carried out of a first substrate having a first layer made of a first material with a second substrate having a second layer made of a second material, the first material and the second material being of different natures and selected from alloys of elements of columns III and V, the method having the steps of: a) providing the first substrate and the second substrate, b) bringing the first substrate into contact with the second substrate so as to form a bonding interface between the first layer and the second layer, c) performing a first heat treatment at a first predefined temperature, d) thinning one of the substrates, e) depositing, at a temperature less than or equal to the first predefined temperature, a barrier layer, on the thinned substrate, and f) performing a second heat treatment at a second predefined temperature, greater than the first predefined temperature.

15 Claims, 3 Drawing Sheets

(51) Int. Cl.
*H01L 21/762* (2006.01)
*H01L 23/00* (2006.01)
H01L 21/306 (2006.01)
H01L 31/0725 (2012.01)
H01L 31/0735 (2012.01)

(52) U.S. Cl.
CPC ........ *H01L 24/80* (2013.01); *H01L 21/30612* (2013.01); *H01L 31/0725* (2013.01); *H01L 31/0735* (2013.01); *H01L 2224/80004* (2013.01); *H01L 2224/8009* (2013.01); *H01L 2224/80011* (2013.01); *H01L 2224/80055* (2013.01); *H01L 2224/80075* (2013.01); *H01L 2224/80894* (2013.01); *H01L 2224/80948* (2013.01); *H01L 2924/10329* (2013.01); *H01L 2924/10335* (2013.01)

(56) References Cited

OTHER PUBLICATIONS

J. Gösele et al.; "Semiconductor Wafer Bonding;" Annual Review of Materials Science; vol. 28; No. 1; 1998; pp. 215-241.

\* cited by examiner

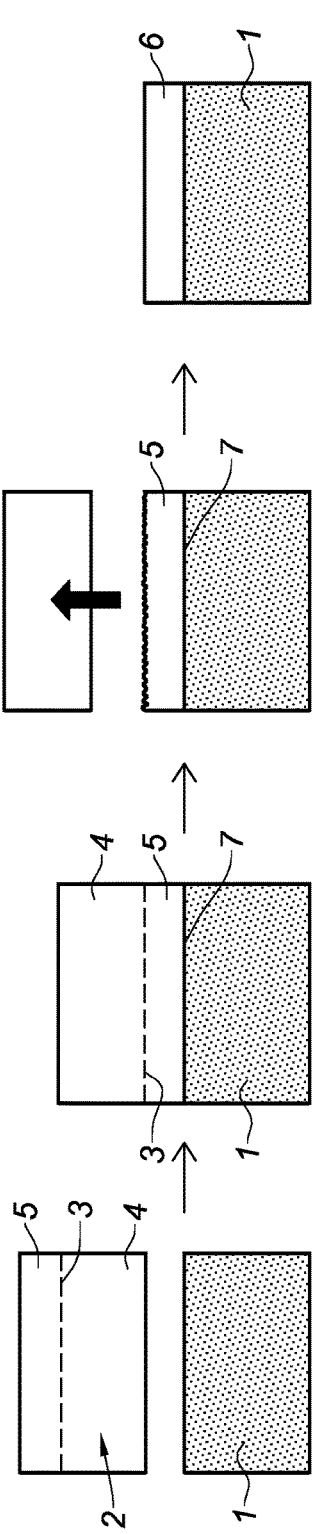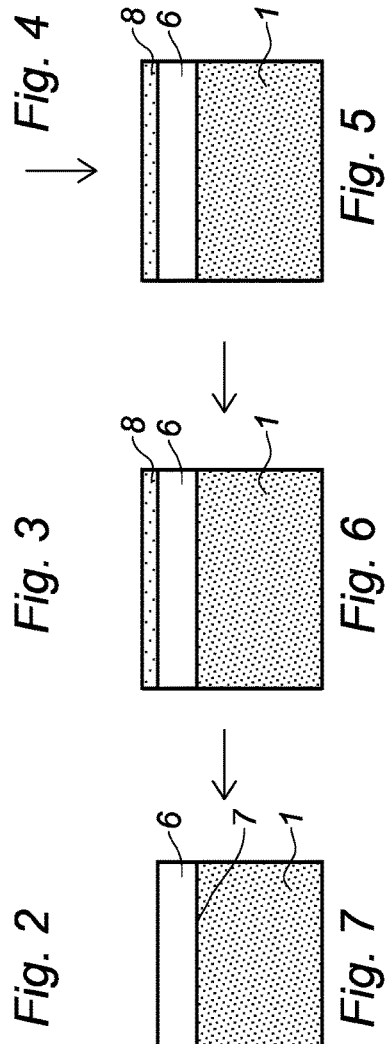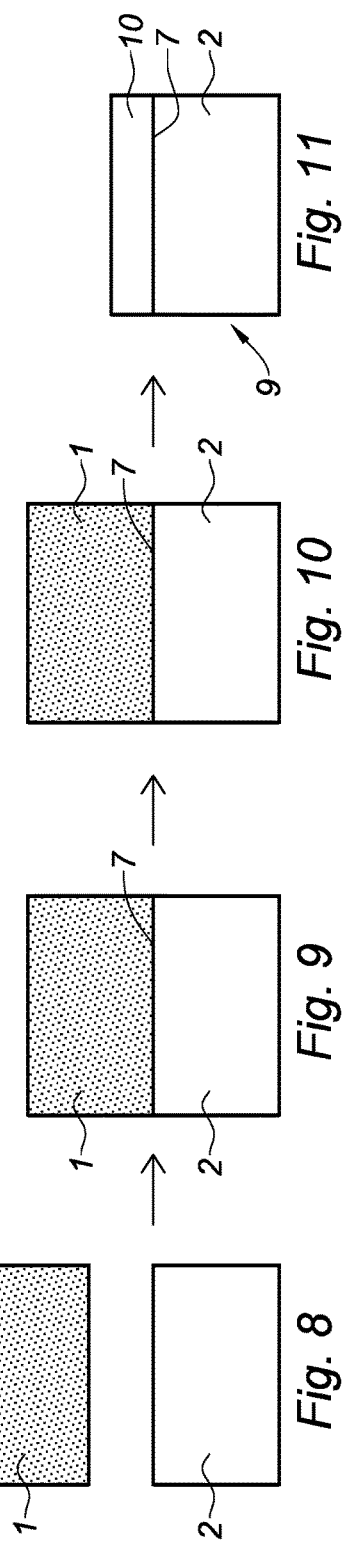

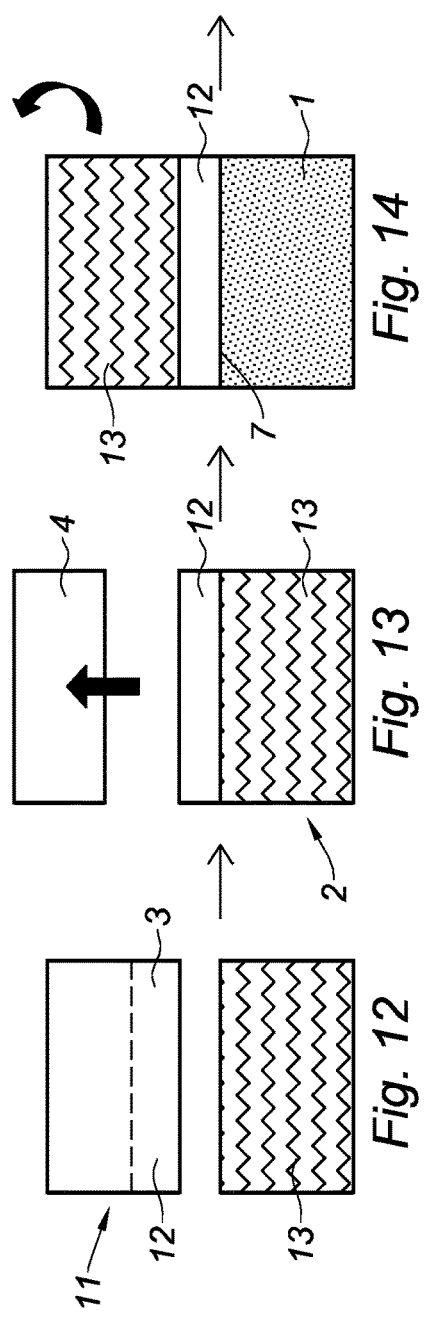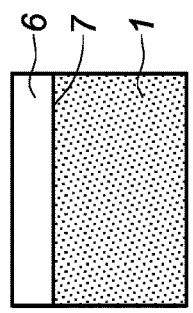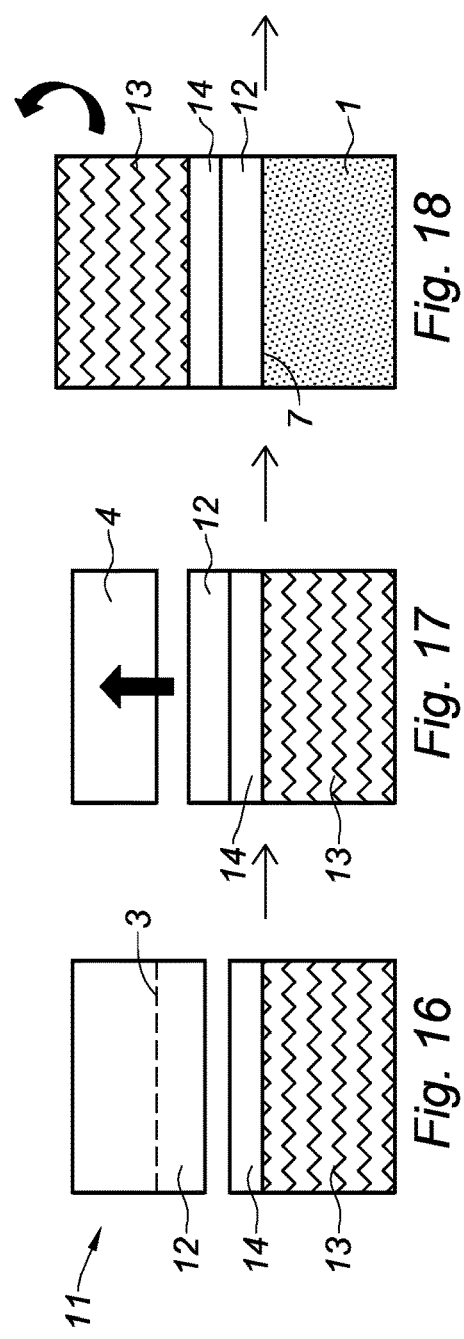

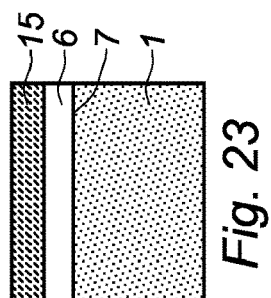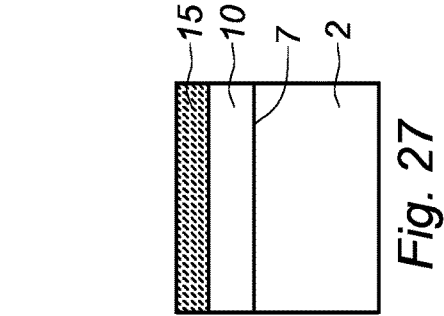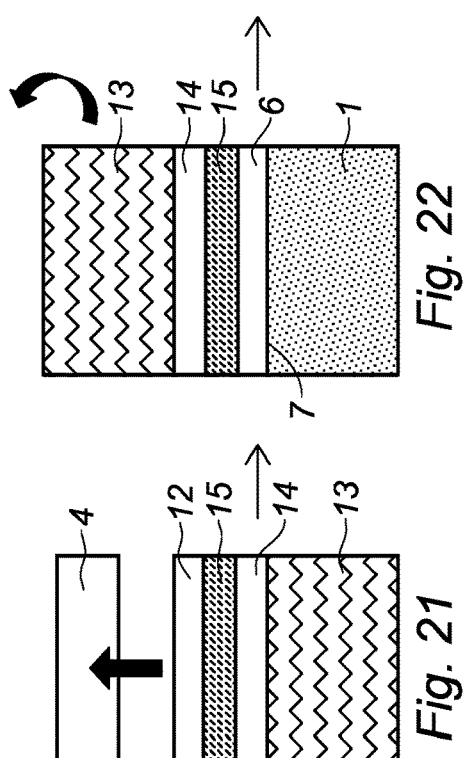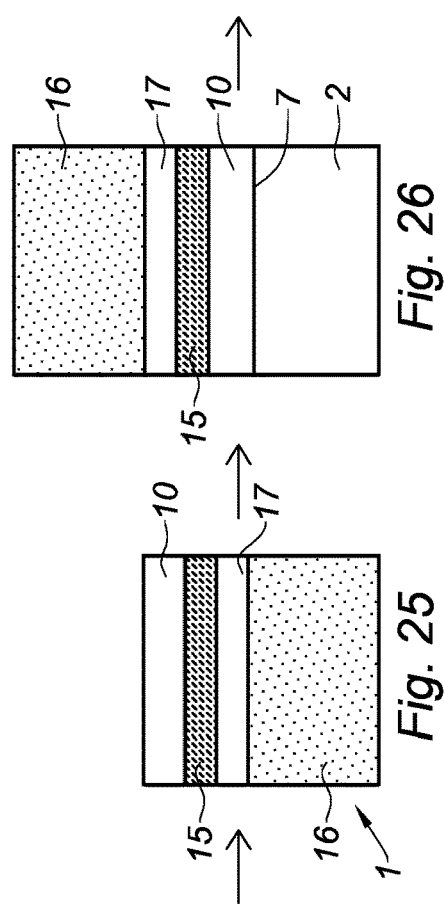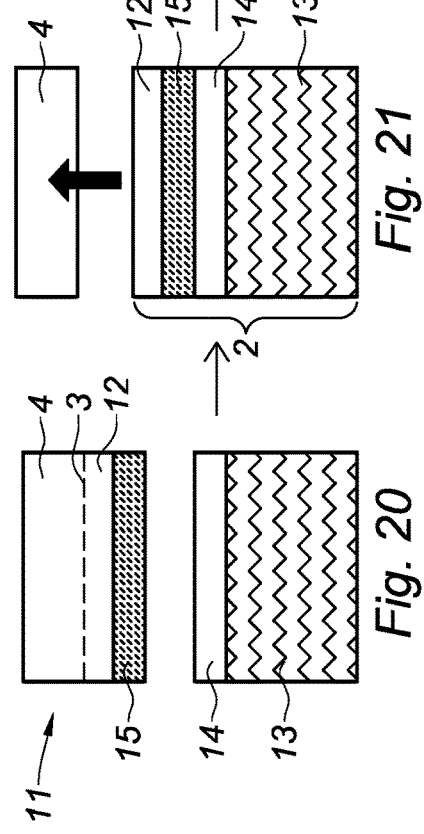

DIRECT BONDING METHOD

The present invention concerns an improved direct bonding method between substrates made of different materials, selected from alloys of elements of columns III and V and in particular a direct bonding method between InP and GaAs substrates.

The integration of different InP— and GaAs-based materials is not achievable without defects, directly by the epitaxial growth techniques, due to differences in the properties of these materials (difference in thermal expansion and mesh parameter). An alternative is a direct bonding of InP and GaAs allowing obtaining a vertical stack of these materials and producing new heterostructures, without deterioration of the material properties.

The direct bonding of InP and GaAs is relatively well known in the literature, and different assembly conditions have been described (hot bonding, vacuum bonding, . . . ).

When transferring a thin film made of an InP or GaAs-based material, the microscopic and macroscopic defects present at the bonding interface are extremely important, since they may lead to strong defectiveness of the transferred thin film, in the form of liftings of the film or even of local detachments. These bonding problems have been reported in the document {Solid-State Electronics 46 (2002) 1103-1108} describing the formation of bubbles on a thin InP film transferred onto a GaAs substrate by direct bonding. In order to avoid the formation of these bubbles, the authors propose to produce trenches in the thin film so as to promote the removal of gas reaction products from the bonding. This approach has many drawbacks: the transferred active layer (InP thin film) is discontinuous, which may make it incompatible with some devices. Furthermore, expensive photolithography steps are required and the etched portion of the active layer to form the trenches is lost.

Within the context of the production of concentrator photovoltaic cells (CPV) with four junctions, the following steps were proposed by F. Dimroth et al. (in "Wafer bonded four-junction GaInP/GaAs/GaInAsP/GaInAs concentrator solar cells with 44.7% efficiency", Prog. Photovolt: Res. Appl., 2014):

two junctions are epitaxial on a first GaAs substrate
two junctions are epitaxial on a second InP substrate
the 4 junctions are assembled by direct bonding of III-V alloys (for example InP/GaAs)
the 4 junctions are transferred on the second InP substrate after removal of the first GaAs substrate.

The removal of the first GaAs substrate may be performed by chemical or mechanical thinning or by the laser lift-off technique in the case where the first substrate is a GaAsOS substrate (GaAs-On-Sapphire, produced by Smart Cut™). The quality of the InP—GaAs bonding interface is therefore critical for obtaining homogeneous and defect-free transferred junctions.

In the same manner, the production of a composite substrate consisting of a thin InP film transferred on a GaAs substrate by Smart Cut™ uses a step of direct bonding InP/GaAs which directly influences the quality of the transferred InP film. This type of InPOGaAs substrate (for InP-On-GaAs) is particularly interesting in replacement of the very expensive massive InP substrate used for the production of solar cells CPV with 4 junctions. The possible bonding defects cause transfer defects in the InP film, which affect the epitaxial junctions on the InPOGaAs substrate and in the final assembly of the 4 junctions. It is therefore essential to preserve the bonding interface from any defect.

Conventionally, the problem of bonding defects is handled by adaptating the technological steps carried out on the surfaces before bringing them in contact: cleaning, plasma, rinsing, drying, . . . . In some cases, the mode of bringing in contact may also influence the quality of the bonded structures: hot, vacuum, pressure bonding, . . . .

An object of the present invention is to overcome one of the aforementioned drawbacks by proposing in particular a specific integration of steps after bringing in contact to obtain an improved direct bonding. To this end, the present invention concerns a direct bonding method of a first substrate comprising a first layer of a first material with a second substrate comprising a second layer of a second material, the first material and the second material being of different natures and selected from alloys of elements of columns III and V, the method comprising the steps of:

a) Providing the first substrate and the second substrate,
b) Bringing the first substrate and the second substrate into intimate contact so as to form a bonding interface between the first layer and the second layer,
c) Performing a first heat treatment at a first predefined temperature over a first predetermined duration,
d) Thinning one of the first substrate and the second substrate,
e) Depositing, at a temperature less than or equal to the first predefined temperature, a barrier layer, on the thinned first substrate or on the thinned second substrate, and
f) Performing a second heat treatment at a second predefined temperature, greater than the first predefined temperature, on a second predetermined duration.

Thus, the use of a barrier layer and a double consolidation annealing of the bondings, associated according to a specific integration at steps of bonding and thinning, allows carrying out an improved direct bonding. Step b) of bringing into contact allows initiating the direct bonding. Said direct bonding is initiated by bringing the surfaces of the first substrate closer to the second substrate until reducing their distance to only a few nanometers. The step c) allows performing a first consolidation of the direct bonding at a first temperature affecting little or not at all the substrates by the constraints related to the difference in thermal expansion coefficient of the material. This first consolidation allows reaching a sufficient stability of the bonding interface in order to allow its handling. It is therefore possible to apply new methods on the bonded structure and to carry out in particular step d) of thinning one of the two substrates. This thinning allows obtaining the composite structure object of the invention, constituted by a thin III-V film transferred on a III-V substrate. Moreover, the thinning allows reducing the stored elastic energy of the bonded structure related to the difference of expansion of the material when the bonding is subjected to large thermal amplitudes. Thus, the structure is less fragile after thinning. The barrier layer deposited on the thinned substrate according to step e), for example by PECVD (acronym of Plasma Enhanced Chemical Vapor Deposition), CVD (Chemical Vapor Deposition) or PVD (Physical Vapor Deposition), respects the first predefined temperature, in order not to alter the bonding and in particular so as to prevent the occurrence of bubbles at the bonding interface.

This barrier layer has the effect of limiting the trapping of gaseous species at the bonding interface upon performing the second heat treatment according to step f). Indeed, species, for example O, H, C, N but also in minor amounts Ar, Ne, He, Kr, and/or Xe, are present in the atmosphere and in the bonded structures, and can diffuse into the material until reaching the bonding interface when high temperatures are reached.

The presence of these species at the bonding interface is likely to alter the quality of the bonding. The barrier layer must have a sufficient thickness, at least 100 nm, to be effective and to form an effective protection against the diffusion of the species towards the bonding interface. It is formed on the surface of the thinned substrate which is most likely to interact with the bonding interface, because of its proximity. Finally, the second heat treatment according to the step f) performed at a second predefined temperature greater than the first temperature allows the reinforcement of the bonding energy between the first layer and the second layer. Due to the barrier layer, the used second temperature may, for example, reach 600° C., without the risk of too significant trapping of gaseous species at the bonding interface or of generating constraints related to the difference in expansion of the material because one of the substrates is thinned or of avoiding deterioration of the thin film (evaporation P, . . . ). This second heat treatment at 600° C. also allows reducing the electrical resistivity of the bonding interface.

It is understood in the present document that the direct bonding is a bonding by molecular adhesion, opposite to the bonding using layers of adhesives, polymer, glue, wax, metal layer deposition, etc. Similarly, it is understood in the present application that the direct bonding of the first layer with the second layer is carried out by direct contact between the first material and the second material, since it may be obtained via a layer called bonding layer, such as a silicon oxide layer, present at the interface and likely to generate many hydrophilic bonds at the interface, facilitating the initiation of the bonding. The material of the bonding layer may be $SiO_2$ or another material selected for its properties adapted to the intended subsequent applications, in particular in terms of optical transparency and electrical conductivity. In the case of $SiO_2$, the thickness will be limited to a few nanometers (typically less than 6 nm) in order to keep a sufficient electrical conduction. When the bonding layer should be optically transparent, it is formed of a material which does not absorb in the concerned wavelengths in the subsequent applications. In the photovoltaic field, for example, the bonding layer may be formed of a binary, ternary or quaternary alloy of elements of the groups III and V.

According to an arrangement, the first material and the second material are selected from GaAs and InP. Indeed, it is known that species, in particular oxygen and hydrogen, are capable of diffusing, for example, into InP or GaAs during annealing at high temperatures, in particular over 300° C.

Advantageously, the first predefined temperature is lower than or equal to 300° C.

Preferably, the second predefined temperature is greater than 300° C., and more preferably the second predefined temperature is comprised between 500 and 600° C.

According to a possibility, the step d) of thinning comprises a step of thinning of the first substrate or the second substrate, until reaching a thickness of the first layer or of the second layer comprised between 1 nanometer and 10 micrometers preferably between 10 nanometers to 5 micrometers, typically around 1.5 micrometers.

According to another possibility, the first substrate is formed by the first layer and the second substrate is formed by the second layer. In this configuration, the step d) thus consists in thinning the first layer or the second layer.

According to the considered materials, the step d) is advantageously carried out by chemical-mechanical polishing (CMP), by chemical etching or by implantation of ionic species followed by a fracture or a combination of these techniques.

Of course, the first material and the second material may be doped prior to step a).

Preferably, the step b) of bringing into contact is carried out under an atmosphere comprising a $H_2O$ content lower than 40% RH, preferably lower than 5 ppm, and preferably anhydrous, and/or under vacuum. Indeed, these conditions allow avoiding a detachment due to the massive degassing of $H_2$ and the constraints related to the differences in CTE.

The vacuum pressure does not exceed 0.1 mbar and preferably lower or equal to $5.10^{-2}$ mbar.

The anhydrous atmosphere comprises an $H_2O$ content lower than 0.5 ppm.

According to a configuration, the step c) of performing a first heat treatment is carried out under a gas flow, such as a $N_2$ or Ar flow.

It is possible to apply the first heat treatment under vacuum or atmospheric pressure.

According to an arrangement, the step f) of performing a second heat treatment is carried out at a second temperature greater than 300° C. and preferably between 500 and 600° C.

Preferably, the step f) of performing a second heat treatment is carried out in the same atmosphere as the first heat treatment.

Advantageously, the step c) of performing a first heat treatment and/or the step f) of performing a second heat treatment are carried out over a duration comprised between 10 minutes and 5 hours and preferably over a duration of about 1 hour to 2 hours.

In order to optimize the effect of the barrier layer, said barrier layer comprises one or more stacked layer(s) of different barrier materials. The expression 'barrier materials' means the materials used in the barrier layer.

Preferably, the barrier layer has a thickness greater than or equal to 100 nanometers, and more preferably, the barrier layer has a thickness comprised between about 100 nm and 1 micrometer.

Indeed, such a barrier layer allows reducing by 90% the amount of gas present at the bonding interface and resulting in the formation of bubbles in the first or second transferred layer.

This amount of gas is evaluated from the measurement of the bubble dimensions (height, diameter) and their density, for example by using an optical profilometer. The amount of gas present in the bubbles is calculated in two times:

1—Calculation of the pressure in each bubble by the Timoshenko equation (a simplified form of the equation is presented here in the context of the same material for the substrate and the layer):

$D = 3(1-v^2)PR^4/16Ee^3$ with D: height of the bubble, R: radius of the bubble, e: thickness of the transferred film, E and v: mechanical parameters of the film, P: pressure in the bubble.

2—Calculation of the amount of gas $n_{gaz}$ in each bubble by the equation of the ideal gas law:

$PV = n_{gaz} kT$ with V: volume of the bubble, T: ambient temperature, $n_{gaz}$: the number of particles, k: Boltzmann constant The total amount of gas present in the bubbles corresponds to the sum of amount of gas present in each bubble.

Preferably the barrier materials are selected from silicon oxide, silicon oxynitride, silicon nitride, glass and alumina, such as $SiO_2$, $Si_xO_yN_z$ and $Al_2O_3$. These materials can be used alone or in combination. Other materials conventionally used to prevent the decomposition or thermal oxidation of GaAs or InP may also be used, advantageously they may serve as an additional layer besides the aforementioned materials which will be in direct contact with the thinned layer. Used deposition techniques and the nature of the barrier or "encapsulant" materials are in particular referenced in the article of K. D. Oberstar et al., "Thin film encapsulants for annealing GaAs and InP", Thin Solid Films, 103 (1983) 17-26.

Advantageously, the chemical composition may vary during the deposition of the barrier layer by modifying the precursor gases in order to adapt the layer to prevent the damage of the material on which it is deposited upon its formation and removal. For example, the barrier layer is initially deposited in the form of SixOyNz in order to evolve until reaching the stoichiometry of $Si_3N_4$.

According to a configuration, the method comprises, after the step f), a step g) of removing the barrier layer. The removal method and the nature of the barrier are selected so as not to leave surface residues or defects. Similarly, this removal is carried out under conditions allowing preventing the deterioration of the physical and electrical properties of the underlying layer.

Advantageously, the step g) of removing the barrier layer is obtained by etching, in particular by using a HF aqueous solution whose concentration is comprised between 10 and 49%. These conditions allow a simple and effective removal. Generally, the removal carried out with this reagent is obtained in less than 10 minutes, which limits the possible damage of the underlying material.

According to a first arrangement, the first substrate and/or the second substrate are massive.

According to a variant, the method comprises, prior to the step a), a step i) of implanting ionic species into the first substrate or the second substrate so as to form a weakening plane in the first substrate or the second substrate, delimiting a film and a negative, the film including at least respectively the first layer or the second layer. Thus, during carrying out the step b), a weakened substrate is brought into contact with another non-weakened substrate in order to initiate the bonding. Then, a simple fracture of the weakened substrate allows the thinning according to the step d) of the invention and the transfer of a film including the first layer or the second layer. The recovered negative is therefore recycled for a new use and for reducing manufacturing costs.

Advantageously, the fracture of the weakening plane separating the film from the negative is carried out by the step c) of performing a first heat treatment. Thus, the execution of step c) allows the simultaneous realization of the step d).

Under these conditions, the step d) of thinning comprises a step of polishing a damaged portion of the film by the implantation of ionic species in the step i).

In a second variant, the method comprises prior to the step a):
  a step j) including the provision of a source substrate including a weakening plane formed by implantation of ionic species, the weakening plane delimiting on either side a negative and a thin layer comprising at least the first layer or at least the second layer, and,
  a step jj) of transferring the thin layer on a temporary substrate so as to form the first substrate or the second substrate provided in the step a).

It is understood that the transfer according to step jj) is carried out conventionally by bringing the at least one thin layer and the temporary substrate into contact, and by applying a heat treatment allowing the fracture of the source substrate at the weakening plane. When the first material is made of GaAs or InP, the material of the temporary substrate is selected to have close CTEs, such as sapphire, molybdenum or GaAs . . . .

According to a possibility, the transfer step jj) comprises the bringing of the first layer or the second layer into contact with the temporary substrate via a bonding interface comprising a sacrificial layer.

In this arrangement, the sacrificial layer is configured to allow the subsequent detachment of the temporary substrate and the film when the film is bonded to the first substrate or to the second substrate. For example, the sacrificial layer is formed of an absorbent material with a wavelength at which the temporary substrate is transparent. The irradiation of the sacrificial layer at the absorption wavelength through the temporary substrate allows the detachment of said second substrate.

Advantageously, the bonding interface comprises a first bonding layer and a second bonding layer extending respectively on either side of the sacrificial layer. Thus, the first or second underlying layer is not damaged by the calorific energy released during the absorption of the radiation by the sacrificial layer.

According to another possibility, step jj) comprises the transfer of the first layer or the second layer and at least one epitaxial active layer on the first layer or the second layer such that the first substrate or the second substrate provided in the step a) comprises a stack including a temporary substrate, at least one epitaxial active layer and respectively the first layer or the second layer. The obtained structure thus comprises a bonding interface between the desired materials of the columns III and V and one or more epitaxial active layers under good conditions on the first or second layer serving as a seed. It is possible for example to form junctions for photovoltaic cells by this means.

According to a third alternative, the method comprises, prior to step a), a step ii) of manufacturing the first substrate or the second substrate including:
  an epitaxy of at least one active layer on a wafer, and
  an epitaxy on the at least one active layer, respectively, of the first layer made of the first material or the second layer made of the second material.

Thus, the first or the second substrate provided in the step a) of the method comprises respectively the first layer or the second layer and at least one active layer.

Advantageously, the wafer comprises the first material or the second material. The wafer serves as a seed for the epitaxy of the at least one active layer and due to the nature of the material thereof, identical to that of the first layer or the second layer, it does not generate additional constraints related to the difference in the expansion of the materials.

Preferably, the step ii) comprises an epitaxy step of an etching stop layer on the wafer prior to the epitaxy of the at least one active layer. This configuration allows facilitating the thinning by etching of the first or second substrate.

Advantageously, when the wafer is made of GaAs, the etching stop layer is constituted of GaInP.

Preferably, the method comprises, prior to step a), a step iii) of preparation for the bonding of the first substrate and the second substrate, in particular by a cleaning in a bath of a wet solution selected from $(NH_4)_2S$, HF, $NH_4OH$, $H_2SO_4$ and/or by plasma treatment of ionic species based on $SF_6$, $N_2$, $O_2$ of the surfaces of the first and second substrates to be bonded.

The chemical cleaning is in particular carried out for 10 to 60 min and preferably for about 40 minutes.

When the cleaning is carried out in a bath of $(NH_4)_2S$, for example at 20%, the substrates are rinsed with water, brushed and/or dried before being brought in contact according to step b).

Other aspects, objects and advantages of the present invention will appear better upon reading the following description of several embodiments of said invention, given by way of non-limiting examples and made with reference to the appended drawings. The figures do not necessarily respect the scale of all the represented members so as to improve their readability. Dotted lines are used on the figures so as to illustrate a weakening plane. In the rest of the description, in the view to simplifying, identical, similar or equivalent members of the different embodiments take the same numerical references.

FIGS. 1 to 7 illustrate the direct bonding method according to a first embodiment of the invention.

FIGS. 8 to 11 illustrate a variant of the first steps of the method according to a second embodiment of the invention.

FIGS. 12 to 15 illustrate another variant of the first steps of the method according to a third embodiment of the invention.

FIGS. 16 to 19 illustrate yet another variant of the first steps of the method according to a fourth embodiment of the invention.

FIGS. 20 to 23 illustrate the method according to another embodiment of the invention.

FIGS. 24 to 27 illustrate yet another variant of the method according to the invention.

As illustrated in FIG. 1, the method comprises a step a) of providing a first massive n-doped GaAs substrate 1 with silicon ($1^E17$ to $1^E19/cm^3$) and a second n-type doped InP substrate 2 with sulfur ($1^E17$ $at/cm^3$ to $1^E19$ $at/cm^3$). Beforehand, a step i) of implanting hydrogen-based ionic species is carried out in the second substrate 2 with a dose of $6.5^E16$ $H/cm^2$ and an energy of about 100 KeV at a temperature of about 150° C. This step leads to the formation of a weakening plane 3 delimiting an InP negative 4 and a film 5 comprising a second layer 6 made of the second InP material having a thickness in the range of 780 nm. Then a cleaning step ii) is carried out by dipping the first substrate 1 and the second substrate 2 in a bath of a $(NH_4)_2S$ solution at 20% for a duration comprised between 10 and 60 min, followed by a rinse with water and a brushing and/or a drying. Once these substrates 1, 2 are prepared for bonding, they are brought in intimate contact under average vacuum, between 0.1 and 0.05 mbar, in order to form a bonding interface 7 (FIG. 2) according to step b) of the method. According to a possibility (not illustrated), a bonding layer is deposited prior to the cleaning on the first substrate 1 and/or the second substrate 2 before bringing in contact. The step c) of applying the first heat treatment is then carried out at 275° C. for a first duration comprised between 1 h 30 and 2 h 30. This annealing step of the bonding also causes the thinning of the second substrate 2 according to step d) by fracture at the weakening plane 3 (FIG. 3). Step d) is then concluded by chemical-mechanical polishing of the portion of the film 5 damaged by the ionic implantation. As illustrated in FIG. 4, there is obtained an InP film 5 of a thickness of about 400 nm forming the second layer 6, transferred on the first massive GaAs substrate 1. Advantageously, the negative 4 of the second InP substrate 2 is recycled for a new layer transfer. A barrier layer 8 constituted of SiO2 is deposited on the second layer 6 with a thickness of 500 nm (step e), FIG. 5). The deposition is performed by PECVD with a $SiH_4$-based precursor and a temperature in the range of 200-300° C. Then a second heat treatment is performed according to a step f) at 600° C. under nitrogen flow for a second duration of about 2 hours (FIG. 6). Once the stabilization annealing of the bonding has been performed, a step g) of removing the barrier layer 8 is performed. The stack formed by the previous steps is placed in a HF bath at 20% for 1 to 2 minutes so as to consume all the $SiO_2$ of the barrier layer 8. A final structure 9 of the InPoGaAs type (for InP on GaAs—FIG. 7) is therefore obtained with an amount of gas present in the defects of $1.16^E11$ $at/cm^2$ against $1.16^E12$ $at/cm^2$ obtained when the barrier layer 8 is absent.

FIGS. 8 to 11 illustrate another embodiment of the method including the provision of two massive substrates 1,2 according to step a) (FIG. 8), the bringing in contact in order to initiate the direct bonding according to step b) (FIG. 9), the application of the first heat treatment according to step c) (FIG. 10), and the thinning step d) of the first substrate 1 by rectification, before finishing by chemical etching, with, for example, a $NH_4OH/H_2O_2$-based reagent when the first layer 10 a first GaAs material (FIG. 11). Steps e), f) and g) of the method are then carried out in the same manner as described above. A final structure 9 of the GaAsoInP type is therefore obtained.

FIGS. 12 to 15 illustrate an embodiment which differs from the preceding embodiments upon the manufacture of the first substrate 1 or the second substrate 2. According to a step j) of the method, an InP source substrate 11 has been implanted by ionic species so as to form a weakening plane 3 delimiting a negative 4 and a thin layer 12 including the second InP layer 6. A temporary substrate 13 is brought in contact with the thin layer 12 for a bonding then a fracture at the weakening plane 3 is made, allowing the transfer of the thin layer 12 on the temporary substrate 13 (step jj)—FIG. 13) so as to provide the second substrate 2. Then, bringing in contact with the first GaAs substrate 1 is carried out according to step b) (FIG. 14) followed by a first heat treatment of stabilization of the bonding according to step c). Finally, the temporary substrate 13 is removed according to the thinning step d) of the second substrate 2 including the second layer 6 (FIG. 15). Steps e), f) and g) of the method are then carried out in the same manner as described above.

FIGS. 16 to 19 illustrate an embodiment close to that previously described. The difference lies in that in step jj), the temporary substrate 13 is brought in contact with the thin layer 12, via a sacrificial layer (FIG. 16) allowing facilitating the thinning of step d) of the method (FIG. 18), the degradation of the sacrificial layer leading to the disengagement of the temporary substrate 13. For example, if the temporary substrate 13 is sapphire, the sacrificial layer 14 is advantageously made of an absorbent material at a wavelength at which sapphire is transparent, such as the SixNyHz. In this particular case, a laser irradiation of the sacrificial layer 14 from the rear face of the transparent temporary substrate 13 allows the detachment according to the laser lift-off technology.

According to yet another variant illustrated in FIGS. 20 to 23, at least one active layer 15 is epitaxial on the InP source substrate 11 before implantation by ionic species forming a weakening plane 3. This weakening plane 3 delimits on either side a negative 4 of the source substrate 11 and a thin layer 12 comprising at least the second layer 6 and the at least one epitaxial active layer 15 (step jj) FIG. 20). Then, the manufacture of the second substrate 2 is performed as previously described with reference to FIGS. 16 to 19. The at least one active layer 15 is brought in contact with a temporary substrate 13 via a sacrificial layer 14 for a direct bonding (FIG. 21). According to one possibility, the sacrificial layer 14 is buried in a bonding layer, for example of silicon oxide (not illustrated). Then the fracture is initiated in the source substrate 11 so as to provide the second substrate 2 according to step a), comprising a stack having from the base to the surface: a temporary substrate 13, a sacrificial layer 14, at least one active layer 15 and a second InP layer 6 (FIG. 21). Then, the steps of bringing in contact with the first GaAs substrate 1 according to step b) and of first heat treatment are illustrated in FIG. 22. The temporary substrate 13 is finally removed according to the thinning step d) of the second substrate 2 (FIG. 23) before carrying out steps e) to g).

According to yet another alternative, the manufacture of the first substrate 1 is made by providing a GaAs wafer 16 on which a GaInP etching stop layer is epitaxial. Then, an epitaxy of a plurality of active layers is carried out up to about a thickness of 5 micrometers, on the etching stop layer (FIG. 24) for the manufacture of a photovoltaic cell, layers forming junctions, for example based on GaInAsP, GaInAs, GaInP . . . . Finally, the first GaAs layer 10 is formed on the plurality of active layers 15 (FIG. 25). Then, a step ii) of preparation for the bonding of the first 1 and second 2 InP substrates is carried out by cleaning in a bath of a $(NH4)_2S$ aqueous solution at 20% for about 40 min, followed by a rinsing with water and a brushing, so as to carry out the step a) of providing the first substrate 1 and second substrate 2.

Step b) is then carried out by bringing the first GaAs layer 10 and the second substrate 2 in intimate contact under a vacuum lower than or equal to 0.1 mbar (FIG. 26). The first heat treatment step c) is applied at a temperature comprised between 250° C. and 285° C. for a first duration comprised between 1 h 30 and 2 h 30.

The thinning step d) of the first substrate 1 is carried out by a selective chemical etching with a $NH_4OH/H_2O_2$-based solution which is stopped on the etching stop layer 17. Said etching stop layer is also eliminated by selective chemical etching (FIG. 27).

Steps e) to g) of the method are then carried out as previously described (refer to FIGS. 5 to 7). A step e) of depositing a barrier layer 8 is carried out by PECVD deposition at a temperature comprised between 200 and 300° C. This barrier layer 8 is formed of oxynitride SixOyN with a thickness of about 100 nm on the first implanted substrate 1 and a $SiO_2$ layer with a thickness of about 500 nm. The second heat treatment step f) is carried out at about 500° C., under nitrogen flow for about 2 hours, and step g) of removing the barrier layer 8 is carried out by etching using a HF aqueous solution for a duration typically comprised between 1 min and 30 minutes, for example 5 minutes. It has been estimated according to the aforementioned calculation means that the amount of gas present in the defects is $1.806^E12$ at./cm$^2$ against $2.84^E13$ at./cm$^2$ obtained in the absence of a barrier layer 8.

The steps described above applied to the second substrate 2 and to the second InP layer 6 may be carried out on the first substrate 1 and the first GaAs layer 10 and conversely.

Thus, the present invention provides a determining improvement to the state of the prior art by proposing a bonding sequence in particular between InP and GaAs allowing carrying out bondings without macro or microscopic defects while ensuring good vertical electrical conduction and perfect optical transparency.

Of course, the invention is not limited to the embodiments described above as examples but comprises all technical equivalents and variants of the described means as well as the combinations thereof.

The invention claimed is:

1. A direct bonding method of a first substrate comprising a first layer made of a first material with a second substrate comprising a second layer made of a second material, the first material and the second material being of different natures and selected from alloys of elements of columns III and V, the method comprising the steps of:
   a) providing the first substrate and the second substrate,
   b) bringing the first substrate into contact with the second substrate so as to form a bonding interface between the first layer and the second layer,
   c) performing a first heat treatment at a first predefined temperature over a first predetermined duration,
   d) thinning one of the first substrate and the second substrate,
   e) depositing, at a temperature less than or equal to the first predefined temperature, a barrier layer, on the thinned first substrate or on the thinned second substrate, and
   f) performing a second heat treatment at a second predefined temperature, greater than the first predefined temperature, over a second predetermined duration.

2. The direct bonding method according to claim 1, wherein the first material and the second material are selected from GaAs and InP.

3. The direct bonding method according to claim 2, wherein the first predefined temperature is lower than or equal to 300° C.

4. The direct bonding method according to claim 2, wherein the second predefined temperature is greater than 300° C.

5. The direct bonding method according to claim 1, wherein the step b) of bringing into contact is carried out under an atmosphere comprising a $H_2O$ content lower than 40% RH.

6. The direct bonding method according to claim 1, wherein the step b) of bringing into contact is carried out under vacuum.

7. The direct bonding method according to claim 1, wherein step c) of first heat treatment is carried out under gas flow, such as a $N_2$ or Ar flow.

8. The direct bonding method according to claim 1, wherein the barrier layer comprises one or more stacked layers made of different barrier materials in particular selected from silicon oxide, silicon oxynitride, silicon nitride, glass and alumina.

9. The direct bonding method according to claim 1, comprising, after the step f), a step g) of removing the barrier layer.

10. The direct bonding method according to claim 1, wherein the method comprises, prior to the step a), a step i) of implanting ionic species into the first substrate or the second substrate so as to form a weakening plane in the first substrate or the second substrate, delimiting a film and a negative, the film including at least the first layer or the second layer respectively.

11. The direct bonding method according to claim 10, wherein a fracture of the weakening plane separating the film from the negative is carried out by the first heat treatment of the step c) and in which the step d) of thinning comprises a step of polishing a damaged portion of the film by the implantation of ionic species of step i).

12. The direct bonding method according to claim 1, wherein the method comprises prior to step a):
   a step j) including the provision of a source substrate including a weakening plane formed by implantation of ionic species, the weakening plane delimiting on either side a negative and a thin layer comprising at least the first layer or at least the second layer and, a step jj) of transferring the thin layer on a temporary substrate so as to form the first substrate or the second substrate provided in the step a).

13. The direct bonding method according to claim 12, wherein step jj) comprises the transfer of the first layer or of the second layer and at least one epitaxial active layer on the first layer or the second layer such that the first substrate or the second substrate provided in the step a) comprises a stack including a temporary substrate, at least one epitaxial active layer and respectively the first layer or the second layer.

14. The direct bonding method according to claim 1, wherein the method comprises, prior to the step a), a step ii) of manufacturing the first substrate or the second substrate including:

an epitaxy of at least one active layer on a wafer, and an epitaxy on the at least one active layer of, respectively, the first layer made of the first material or the second layer made of the second material.

15. The direct bonding method according to claim 14, wherein step ii) comprises an epitaxy step of an etching stop layer on the wafer prior to the epitaxy of the at least one active layer.

* * * * *